United States Patent [19]

Rusu et al.

[11] Patent Number: 5,307,286
[45] Date of Patent: Apr. 26, 1994

[54] METHOD FOR OPTIMIZING AUTOMATIC PLACE AND ROUTE LAYOUT FOR FULL SCAN CIRCUITS

[75] Inventors: Stefan Rusu, Sunnyvale; Joseph S. Yang, Freemont, both of Calif.

[73] Assignee: Sun Microsystems, Inc., Mountain View, Calif.

[21] Appl. No.: 988,468

[22] Filed: Dec. 10, 1992

Related U.S. Application Data

[62] Division of Ser. No. 605,557, Oct. 29, 1990, Pat. No. 5,208,764.

[51] Int. Cl.[5] .......................................... H03K 19/173
[52] U.S. Cl. .................................... 364/490; 364/489; 364/488; 307/465.1; 307/303.1
[58] Field of Search ............... 364/488, 489, 490, 491; 307/465.01, 480, 303.1

[56] References Cited

U.S. PATENT DOCUMENTS

5,029,279  7/1991  Sasaki et al. ...................... 364/491

Primary Examiner—Vincent N. Trans
Attorney, Agent, or Firm—Blakely Sokoloff Taylor & Zafman

[57] ABSTRACT

A computer integrated circuit arrangement including flip-flop circuits, buffers, and combinatorial circuit elements in which the flip-flop circuits are arranged in rows with buffers which may be connected to drive signals to those flip-flop circuits, the flip-flop circuits having conductors designed to carry global signals arranged to traverse the width of the flip-flop circuits and provide input and output terminals to match input and output terminals of adjacent flip-flop circuits.

9 Claims, 5 Drawing Sheets

METHOD FOR OPTIMIZING AUTOMATIC PLACE AND ROUTE LAYOUT FOR FULL SCAN CIRCUITS

This is a divisional of application Ser. No. 07/605,557, filed Oct. 29, 1990, now U.S. Pat. No. 5,208,764.

BACKGROUND OF THE INVENTION

1. Field of the Invention

This invention relates to computer circuit layout and, more particularly, to methods and apparatus for automating and providing more effective computer circuit layout design.

2. History of the Prior Art

Computer circuits are designed, developed, and tested by computer circuit designers. Once the design is completed, the circuits must be laid out through some kind of layout graphics editor. Generally, this layout is done by a software tool which uses a standard library of circuit elements and a schematic diagram provided by the circuit designer to generate a layout. Typically, this layout is designed to provide the shortest overall connection between circuit elements. Such a tool is referred to as a place and route tool. A typical tool is "Place and Route" manufactured by Cadence Design Systems, Inc. and described in *Cadence, Place and Route Reference Manual*, Version 2.0, Jun. 22, 1988. Another such tool is "CAL-MP" manufactured by Silvar-Lisco, Menlo Park, Calif.

The layout area available and the circuit schematic diagram to be placed on the area are furnished as inputs to the tool. The tool uses a library of standard circuit cells to place the circuit elements shown in the circuit diagram and to connect those elements according to the circuit diagram. Typically, such a tool produces a circuit layout in which the combinatorial circuit elements (gates) are interspersed with the sequential circuit elements (flip-flops and latches). Once the layout has been produced, certain design elements must be added. For example, it is not until the layout exists that the length of the metal connecting various elements is known; and it is only when the length is known that the buffers for driving circuit elements may be determined. Essentially, it is necessary to first use the tool to plot the layout and then individually design the buffers after computing all of the paths and the lengths of metal. This is very time consuming and, thus, expensive work. The typical layout produced by a place and route tool makes this very difficult because the length of individual metal conductors must be computed, for example, in order to determine the degree of amplification that individual buffers must produce. This makes the design of the buffers which drive signals to the sequential elements such as flip-flops difficult.

Another problem encountered in using place and route tools is that the circuitry, once designed and laid out, must be tested to make sure it functions correctly. This means that testing procedures are necessary to determine the integrity of the individual elements and their interconnections. These testing procedures often require additional metallic conductors be connected between the elements of the chip. In general, the circuit elements are placed by the place and route tool based on the shortest possible interconnect lines which are to be used in the operating circuitry without any reference to testing procedures or connections required by those procedures. Then, after the elements are placed, it is necessary for a designer to go back and individually plot out the connections necessary to accomplish the testing. Once again, this is difficult, time consuming, and therefore expensive work. Moreover, it is not work which allows the length of the metallic connectors used for testing to be minimized.

SUMMARY OF THE INVENTION

It is, therefore, an object of the present invention to provide a method for optimizing the placement of circuit elements in integrated circuit arrangements the layout of which is designed by place and route software tools.

It is another more specific object of the present invention to optimize the placement of flip-flop circuits in an integrated circuit arrangement for both operational and testing purposes.

It is another object of the present invention to allow the optimization of the layout of flip-flops of an integrated circuit block whereby connectors utilized for driving global signals to the flip-flops may be standardized and reduced in length as much as possible.

These and other objects of the present invention are realized in an integrated circuit arrangement comprising flip-flop circuits, buffers, and combinatorial circuit elements in which the flip-flop circuits are arranged together in rows with buffers which may be connected to drive signals to those flip-flop circuits, the flip-flop circuits having conductors designed to carry global signals arranged to traverse the width of the flip-flop circuits and provide input and output terminals to match input and output terminals of adjacent flip-flop circuits.

These and other objects and features of the invention will be better understood by reference to the detailed description which follows taken together with the drawings in which like elements are referred to by like designations throughout the several views.

DETAILED DESCRIPTION OF THE INVENTION

Figure 1:
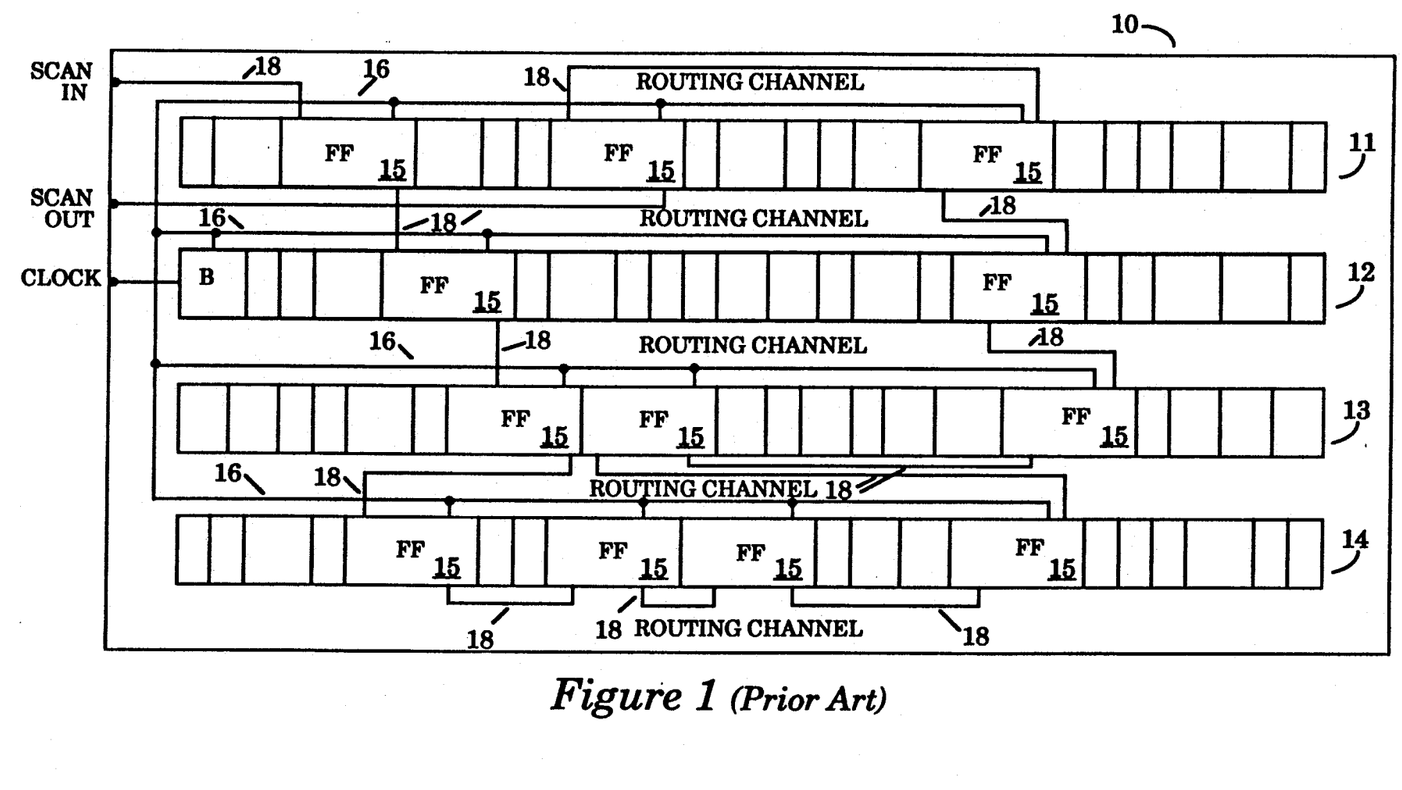
FIG. 1 is a diagram illustrating the placement of various circuit elements in a prior art arrangement designed by a typical place and route software tool.

Referring now to FIG. 1, the layout of a number of circuit elements such as combinatorial circuits and flip-flops on an integrated circuit block 10 is illustrated according to the prior art. In general, small blocks of an integrated circuit are laid out independently using a place and route tool, and then those blocks are combined in a larger integrated circuit which utilizes the entire chip. Each of the cells is illustrated only as a small rectangle. A number of these rectangles are shown positioned next to one another in four horizontal rows 11-14 in the manner in which they would be positioned in the block layout. In general, each of the rectangular cells making up one circuit block is designed to have the same height as the other cells which might appear in a row with it. Each of the rows 11-14 is separated from the adjacent rows and from the edge of the block by routing channels. The routing channels are areas of the block over which are routed the connections between the various circuit cells.

Although a number of different circuit cells are illustrated on the block 10 as is shown by the different sizes of the rectangles depicting these cells, only those which represent flip-flop circuits (FF) 15 and a buffer (B) are identified in FIG. 1. The other circuit cells are combinatorial elements such as AND gates, OR gates, NOR gates, and the like. It will be noted in FIG. 1 that the flip-flop circuits 15 lie interspersed in the different rows 11-14 without any apparent order. This interspersing takes place in response to the inputs to the software tool which define (1) the area of the block 10 which is available for the various circuit elements, (2) the circuit schematic diagrams which depict the circuitry. The place and route software tool takes this information and using the library of circuit cells generates a map in which the circuit cells are laid out in the rows as demonstrated, interspersed as illustrated, and joined by connectors through the routing channels in a manner which is selected to render the overall length of the metallic connectors joining the various circuit cells be the least possible. By providing a layout of this sort, the overall load provided by the metallic interconnections is minimized.

A number of difficulties arise from this pattern of placement of circuit cells. First, a number of circuit cells, specifically the flip-flops 15, all use a number of the same input signals (global signals). All of the flip-flops 15 operate in response to a system clock signal, for example. In the circuit of FIG. 1, it will be seen that the metallic conductors 16 carrying the clock signals to each of the flip-flops will differ in length no matter where the clock signals enter the block 10. With the higher operating frequencies present in modern computers, it is necessary to accurately control the system clock by controlling both the capacitive loading due to the metallic conductors 16 and the buffering of the clock signals. Since it is necessary to apply the clock signal to each of the flip-flops 15, it is necessary with each circuit design, once the place and route tool has been used to lay out the circuit cells and their connections, to go back and determine the amplification of the buffer necessary to produce the clock signals to drive the flip-flops 15. Unless this buffer is accurately determined, the clock skew may be significant enough to affect the operation of the circuitry. Often a single buffer is used for a large portion of the circuitry of the entire integrated circuit. At other times a buffer B is determined and placed on the block 10.

Where the flip-flops 15 are randomly positioned as in FIG. 1, this determination of buffer amplification is very difficult to do. It requires that all of the conductors 16 be individually measured before an estimate of the buffer value can be reached. As pointed out above, this is time consuming and costly.

A second problem posed by this circuit arrangement of the flip-flops 15 which the typical place and route tool produces is due to the fact that it is necessary for the flip-flops 15 to be tested prior to use. This is done by scanning signals which traverse all of the flip-flops 15 of the block 10 in serial order. It makes no difference what is the order of the flip-flops 15 so long as all of the flip-flops are connected together in a chain in which the scan input goes to a first flip-flop, the scan output from that flip-flop goes to the scan input of the next flip-flop, and so on in series. A typical scan test conductor 18 is illustrated in FIG. 1.

At present such a scan chain of flip-flops is usually constructed by hand by an engineer after the circuit elements have been laid out on the block 10 by the place and route tool in the order which minimizes the metallic connections overall. The engineer draws the connections which are to be used for the scan testing and sees that these are placed in the program which controls the actual manufacture of the integrated circuits. Again, this is time consuming and costly. Moreover, the metallic scan test conductors 18 made for scan testing cannot be optimized to minimize length since the circuit elements are already in positions determined by the place and route tool. Consequently, this design of the scan testing circuitry not only costs more but increases the loading on the circuits during testing. It is possible for a circuit designer to designate the scan test conductor 18 connections beforehand in the circuit schematic, but then the scan test conductors 18 simply are laid wherever the place and route tool places them, a pattern which significantly increases the amount of metal on the block.

A number of other connections are also made difficult by the typical arrangement provided by a place and route tool. Each of the flip-flops 15 of a circuit arrangement must also receive reset signals, scan enable signals (to allow the circuit to enter the test mode), and data enable signals (to allow the circuit to hold previous data). Although these signals may not be the same for all flip-flops 15, they will be the same for all flip-flops contained within particular groups. Consequently, the conventional manner of placing the circuit elements and routing these conductors assures that the conductors used to drive these signals will vary in length and load from flip-flop to flip-flop. This assures that more work will be required of the engineer to provide buffers for driving these signals and to eliminate loading factors which affect the timing of these signals.

Figure 2:
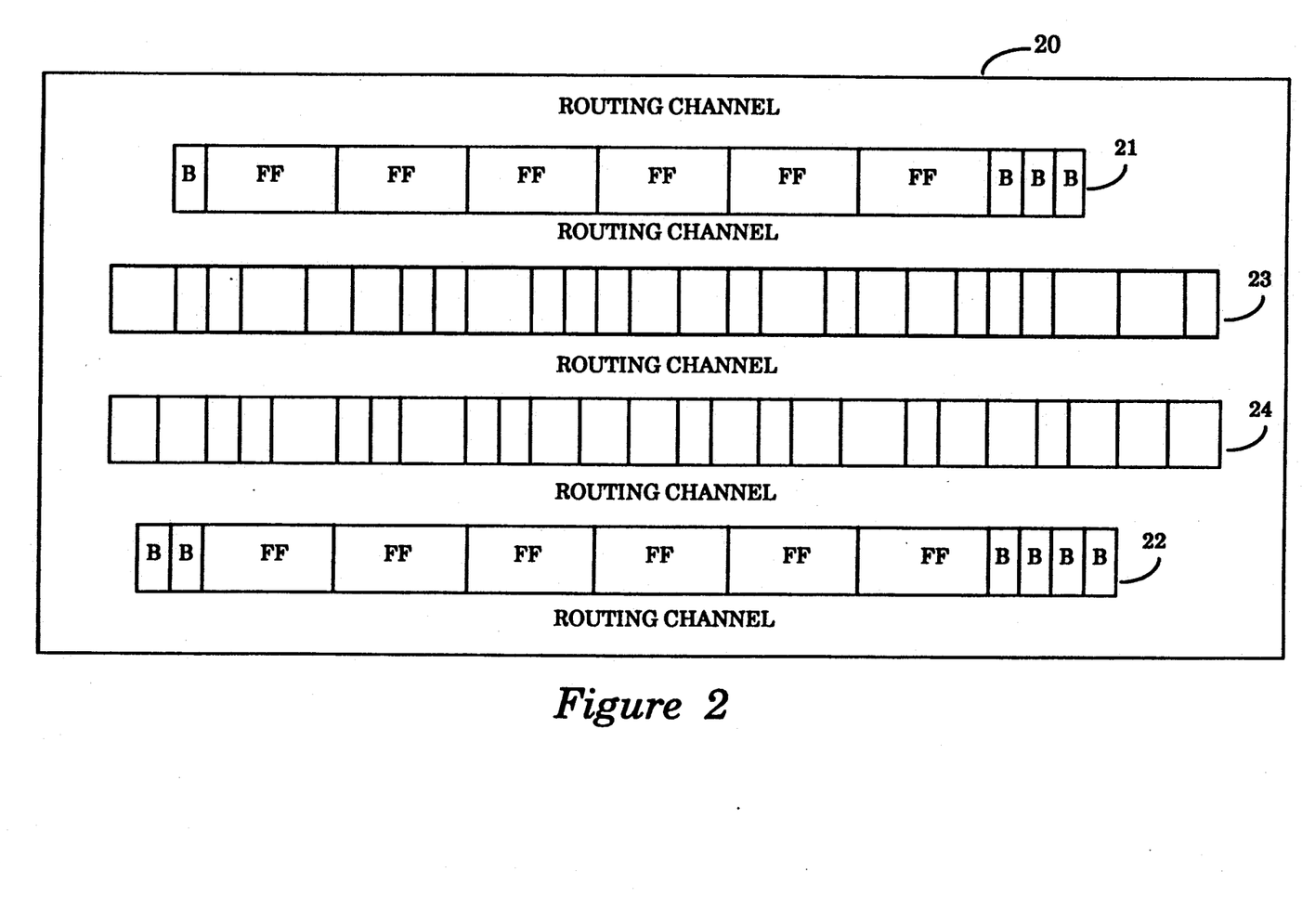
FIG. 2 is a diagram illustrating the placement of various circuit elements in an arrangement designed by a place and route software tool used in accordance with the present invention.

It has now been found that the hand work necessary in the layout of integrated circuits may be substantially reduced by the method and arrangement of the present invention. FIG. 2 illustrates an arrangement of circuit cells accomplished in accordance with the method of this invention in which all of the flip-flops of the entire circuit arrangement on the block 20 are associated in a pair of rows 21 and 22 while all of the combinatorial elements of the circuit arrangement are associated in another two separate rows 23 and 24. Associated with the flip-flops in each row of flip-flops are the buffers (B) used to drive the input signals to those flip-flops. It should not be construed from the particular arrangement shown that only four rows are to be included in any particular circuit arrangement designed using the invention; this number is used only as an example.

By arranging the flip-flops of the circuitry in rows including only flip-flops and buffers, a number of improvement are possible. First, the flip-flops need not be of the same height on the block and use the same layout style as the combinatorial elements since they are no longer positioned in the same rows with those elements. This allows the flip-flops to be designed to have better layout densities. It also allows conductors to be designed into the flip-flop cells to cross those cells and provide input and output terminals to carry the global signals such as the clock to all of the flip-flops. If a standard flip-flop has a conductor crossing it and connecting internally to the positions requiring the clock signal, then the input and output terminals may be placed at exactly the same positions with respect to each flip-flop so that they join when the cells are laid out in abutting positions on the block. In this manner, the clock signals need not be routed by the place and route tool but are routed by simply placing the flip-flops side by side in the rows so the connections are automatically made.

This means that the load to each flip-flop on the clock line will be identical and the total load may be computed by simply adding up the known internal loading for each flip-flop; this may be easily accomplished by storing these values in a table and having the tool do the computation once it has determined the layout. The tool computes the loading and selects a buffer matching this value from the library of standard cells. The tool places this buffer in the row with the flip-flop cells it is to drive. The tool then stores the details of the values for the selected buffer and the connections made to the flip-flops in the row so that these may be back annotated into the schematic. This eliminates the burdensome work involved in computing the value needed for a buffer to drive the clock to any row of flip-flops. In fact, a buffer may be designed and placed in each row of flip-flops by the tool so that no external routing is necessary. This in itself saves substantial effort and cost in the circuit design. A further advantage is the saving in area of the routing channels which would have been utilized for routing the clock lines.

In a like manner, the scan inputs to and outputs from each of the flip-flops (for testing) may be essentially designed into the arrangement. By placing the scan output (actually the data output terminal) of one flip-flop at the scan input of the next flip-flop in the same row, the metal conductors joining the flip-flops for the scan testing are automatically produced thereby eliminating the hand work previously attendant on the design of the scan circuitry and saving most of the area of the routing channels otherwise needed for routing the scan lines. As with the buffers added for the clock circuitry, the scan lines connections and their values are stored by the tool to be back annotated into the schematic.

In a like manner to the clock driving circuitry, the conductors necessary to provide the reset input signals, the scan enable signals, and the data enable signals may be designed into the flip-flop cells to cross those cells and contact the required terminals within the cells. So long as the input and output terminals on the conductors carrying these signals through the cells match, the connection of the conductors will be made without more than laying the flip-flops on the block side by side. Moreover, as with the clock signal conductors, the arrangement provides identical conductor lengths through the cells and easily computable loads for those conductors. The tool simply consults a lookup table for the standard loading values for the flip-flops, totals these values, and selects a buffer for the particular global signal. This renders the design of those circuits and their drivers very easy and saves the area otherwise needed for routing these global signals.

By placing individual buffers for each global signal in each row of flip-flops, individual buffers with the particular characteristics suitable for driving the clock line and other global signal lines may be easily selected so that, for each row of the flip-flops, the metallic conductors are properly driven to produce the same delay and rise and fall times for the clock pulses.

Figure 4:
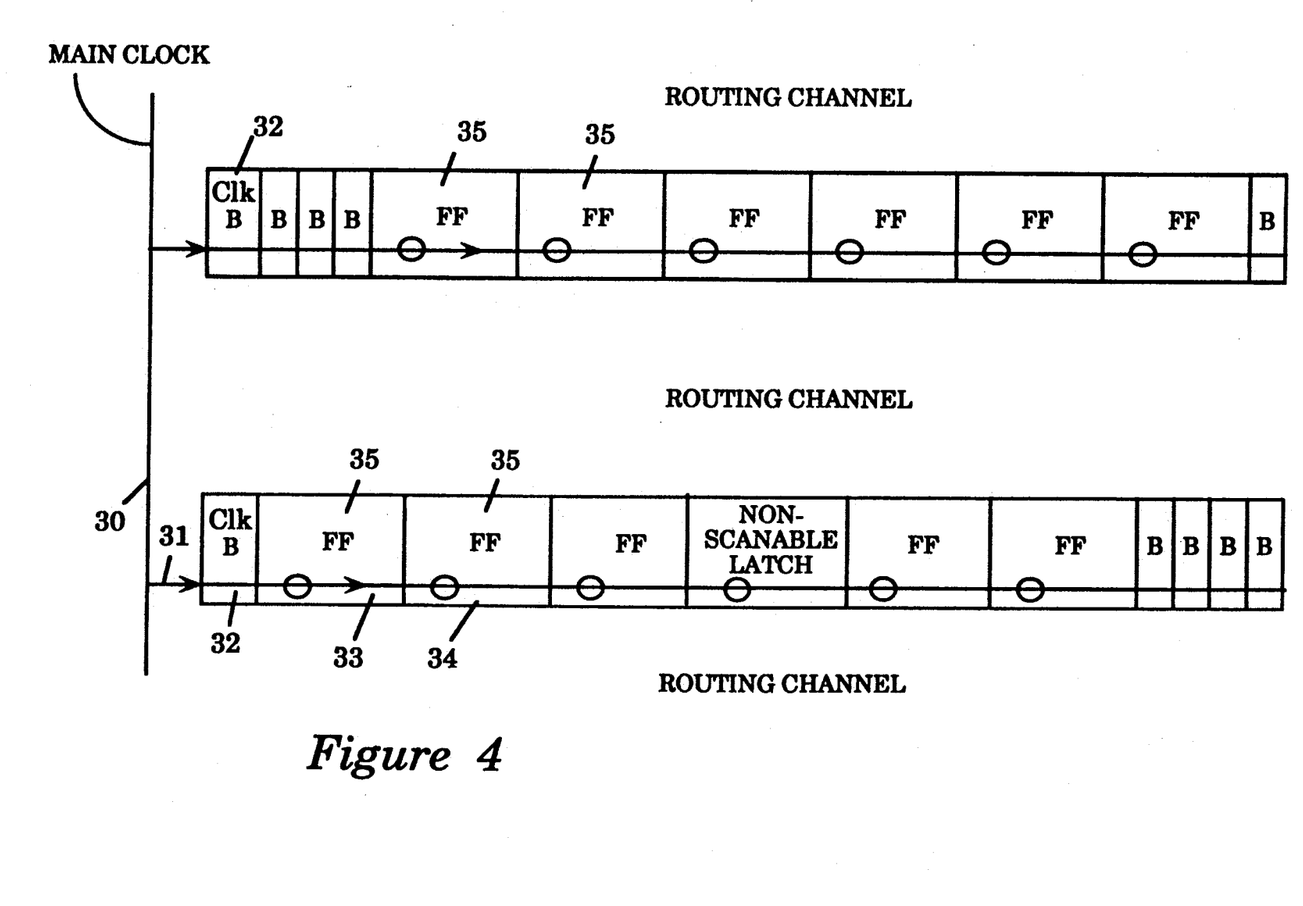
FIG. 4 is another diagram illustrating the placement of various circuit elements and various interconnections in an arrangement designed by a place and route software tool used in accordance with the present invention.

FIG. 4 illustrates an arrangement which points out the manner in which this is accomplished. As may be seen, the main clock is provided on a bus 30 at the left of the rows of flip-flops. This clock is connected by a conductor 31 to a buffer 32 selected to provide the correct amplification for driving the clock lines. A metallic conductor 33 carries the clock signal from buffer 32 through each other buffer in each row of flip-flops to the first of the individual flip-flops 35 in that row. Each conductor 33 connects to each flip-flop at a standard position at the left edge and exits at a standard position on the right edge of the flip-flop so that the flip-flops connect by simple abutment. At any position (such as a buffer cell driving a different global signal) at which an element exists which does not use the input signal, the cell is designed with a conductor which simply passes the signal through the circuitry of that element. The identity of conductors providing the clock signal allows the easy selection of the value for the particular buffer and greatly decreases the design time for accomplishing the layout.

As pointed out, a similar layout of input buffers (as is used for clock signals) may be provided for furnishing the reset, scan enable, and data enable signals to the flip-flops. Although the signals provided on these lines may differ somewhat depending on the types of flip-flops involved, flip-flops of the same type may be grouped together in rows. This allows the routing of these global signals to be taken care of within the flip-flops themselves in the same manner as are the clock signals so that a number of identical connection arrangements may be provided bringing about a substantial reduction in the effort and cost expended in design of the circuit layout. In situations where groups of flip-flops begin and end within a row, of course, the connections outside the cells into the routing channels are made by the routing programs of the tool. Once the routing is known, the tool may use estimated values for the routed lines and total these with the values from the lookup tables for the particular flip-flops to determine buffer values and place the buffers. Again the values of the buffers and their connections to the various flip-flops are stored to be back annotated in the schematic diagrams for the block 10.

Where different types of flip-flops are expected to appear in the same row of a block, conductors may be placed in each flip-flop for carrying reset and similar global signals across the flip-flops which do not use the signals to different types of flip-flops which do use them in a manner similar to the design of connectors running through unused cells in a flip-flop row. Such conductors would be positioned at different heights to connect to the different flip-flop cells.

Figure 3:
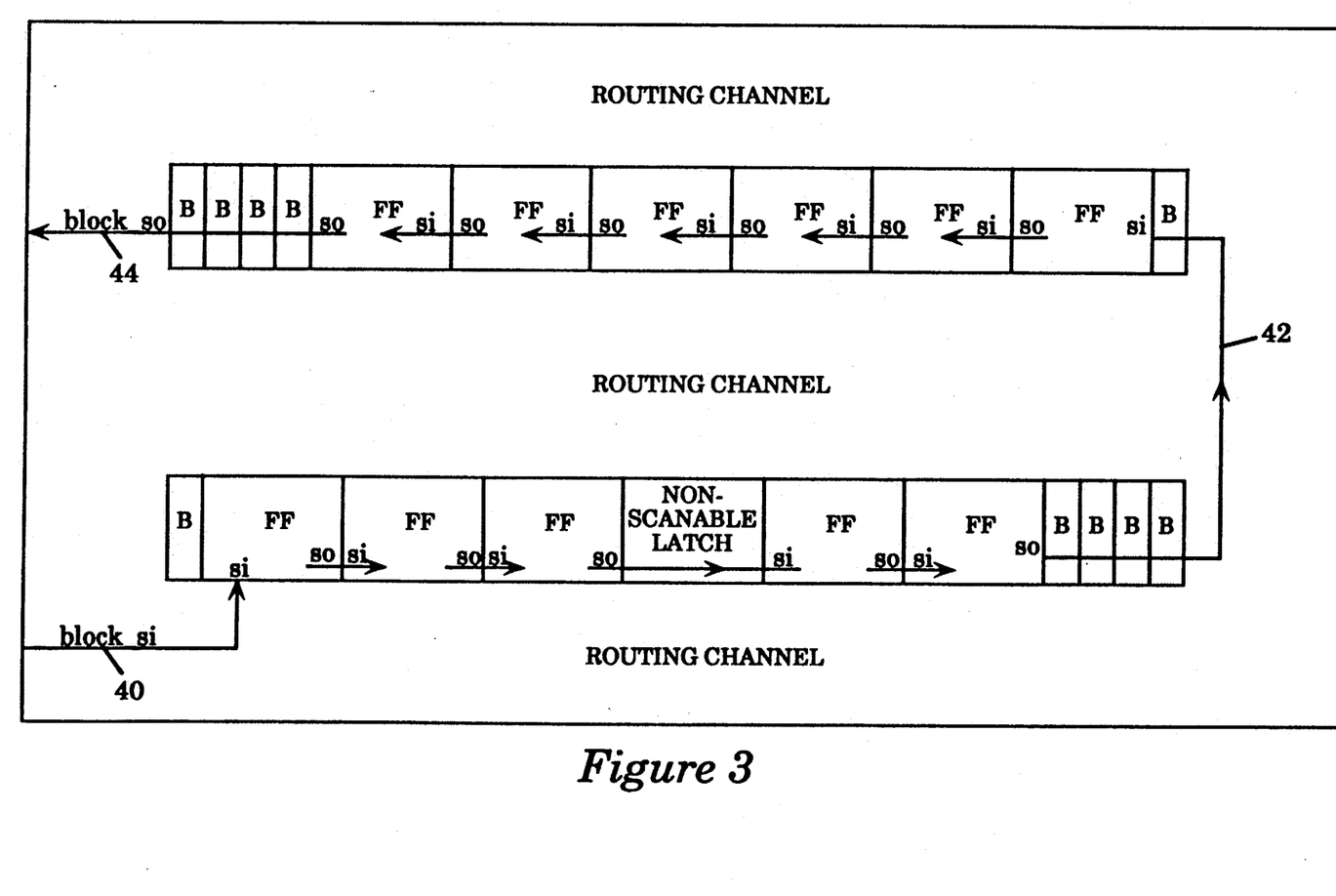
FIG. 3 is a diagram illustrating the placement of various circuit elements and various interconnections in an arrangement designed by a place and route software tool used in accordance with the present invention.

FIG. 3 illustrates the connection of the circuit connectors needed for accomplishing the scan testing of flip-flops in a circuit designed in accordance with the present invention. As may be seen, the scan input signal arrives on a conductor 40 and is placed at the scan input terminal of the first flip-flop in the first row. From that point on through the first row, the scan output terminal of each flip-flop is designed to match and mate with the scan input terminal of the next flip-flop in line. At the end of the first row, the scan output terminal from the last flip-flop is transferred by a metal conductor 42 directly to the scan input terminal of the first flip-flop of the next row above. This connection is made by the routing portion of the tool after the flip-flops have been placed.

The scan line continues from the point of connection to the first row through the second row. The scan output terminal of each flip-flop in the second row is designed to match and mate with the scan input terminal of the next flip-flop in line. At the end of the second row, the scan output terminal from the last flip-flop is transferred by a metal conductor 44 directly to the scan output terminal from the block. This conductor 44 is also routed by the tool after the scan connections have been made internally through the rows of flip-flops. Once the scan lines have been placed, these scan connections are also stored by the tool so that they may be back annotated into the schematic. As may be seen, the scan conductors are shortened as much as is conceivable and the design of the scan conductors is rendered essentially trivial.

In order to implement the invention, the different types of flip-flops to be used in the circuitry are first determined. Then a standard cell is designed for each. The standard cell includes all of the conductors crossing the cell necessary to carry the global signals. Each of these conductors is designed to make the necessary contacts to the circuitry of the flip-flop and to be positioned to match the terminals of the conductors of the adjoining cells when the cells are abutted. If it is expected that a particular signal is to cross a cell, a conductor for this purpose may be built into the cell at a particular height with terminals to match those of adjoining cells. Each of the flip-flops is also designed with scan input and scan output terminals to match the scan input and output terminals of adjoining flip-flop when the cells are abutted. These standard cells are stored in the library of the place and route tool. The place and route tool is then run to place the circuit elements with all of the flip-flops in rows including only flip-flops and buffers. This is accomplished by placing a distinguishing property on the flip-flop template (the master cell in the library of circuits). The tool then routes the conductors. The tool uses a lookup table holding the values of the loading capacitances for each flip-flop and the characteristics of the buffers to determine the value of buffer to be used. The tool adds together the loading values for each global line on a row and selects a buffer which can properly drive that load. The buffer may be placed and connected for any group of flip-flops based on the value. In any case in which a global signal drives less than all of a row of flip-flops so that its conductor must be routed through the routing channel, the tool will still size and place the buffer by using estimated values for the lines external to the circuits.

Thus, it may be seen that the present invention accomplishes the connection of most global signal lines without the necessity of measuring and computing those values by hand. The operation speeds the design of circuit layouts while reducing the loading factors thereby making the timing for such arrangements much more accurately determinable.

Figure 5:
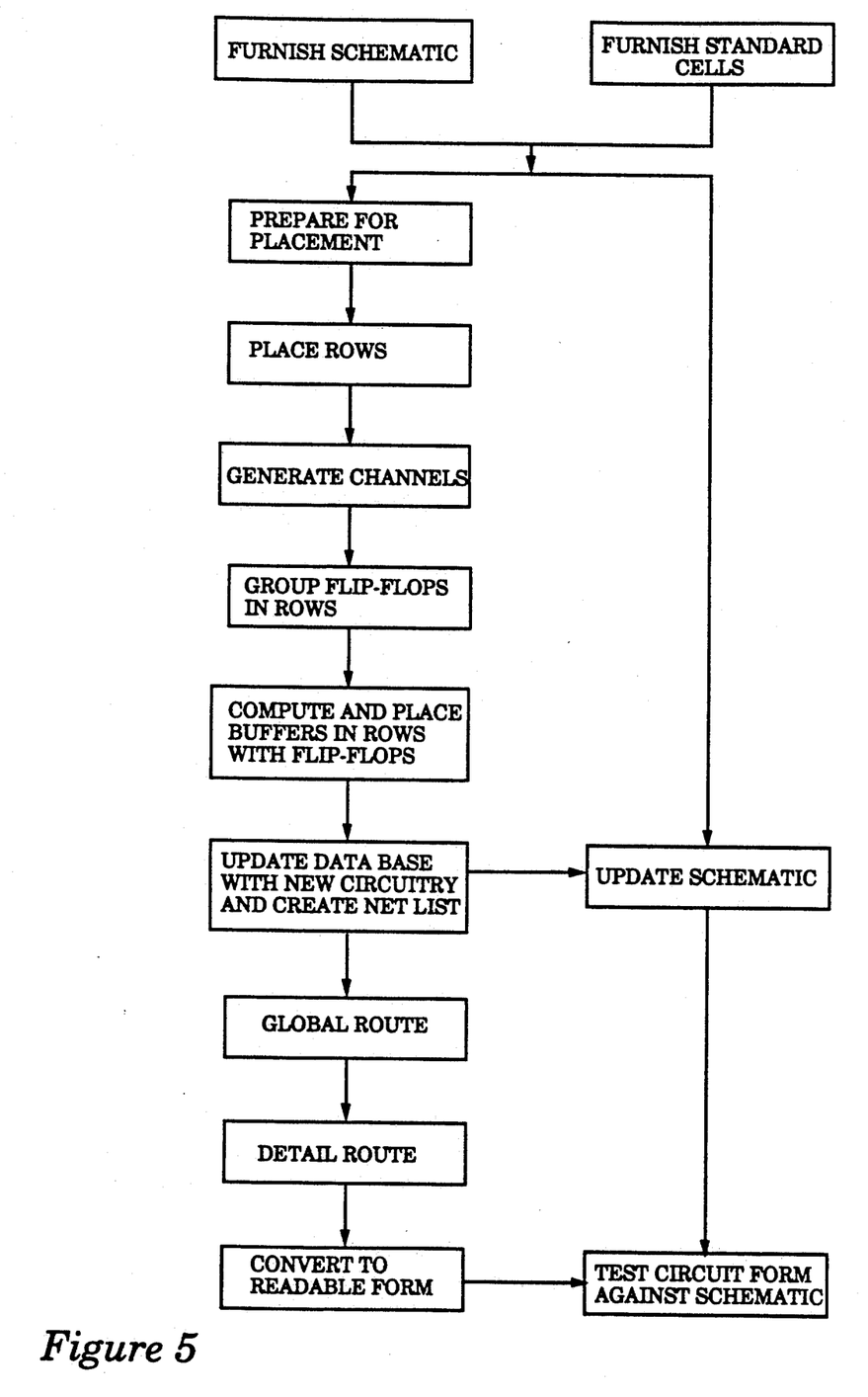
FIG. 5 is a flow chart describing the steps of carrying out the method of the invention.

FIG. 5 is as flow chart illustrating the layout procedure for a particular block of integrated circuitry according to the invention. As may be seen in FIG. 5, a schematic and a library of standard cells are first furnished to the automatic place and route tool. The tool takes these inputs and prepares for placement of the individual cells. The tool then selects and automatically places rows in positions on the board. Next the tool generates the routing channels between the rows.

To this point the method is essentially the same as the prior art. The tool then groups the flip-flops in rows including only flip-flops, similar latches, and buffers in a manner that the scan signal terminals, the clock lines, and other global lines are connected between adjacent cells by abutment. The tool next computes the buffer values for the global signal lines using the lookup tables and estimated values. With these values, these buffers are chosen and placed in the rows with the flip-flops. When the buffer values and connections are determined, these values are stored so that they may be back annotated in the schematic, and a net list is created for accomplishing this back annotation.

Next the tool does the routing of circuit connections to the cells between the rows of cells. It then accomplishes the routing of connections within each of the rows of cells. Finally, the tool converts this new design of circuit layout to a form which may be checked against the schematic diagram. The last step of the method is the check against the updated schematic diagram to which the details of the back annotation referred to above have been added.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An integrated circuit arrangement comprising flip-flop circuits, buffers, and combinatorial circuit elements in which the flip-flop circuits are arranged together in rows with each respective row having a buffer for driving global signals to flip-flop circuits of the respective row, said rows of flip-flop circuits being arranged in separate rows from said combinatorial circuits, said flip-flop circuits each having internal conductors for carrying at least one global signal, said internal conductors of each respective flip-flop circuit having input and output terminals positioned on opposing sides of the respective flip-flop circuit with the input and output terminals of each respective flip-flop circuit arranged to mate with the terminals of adjacent flip-flop circuits.

2. An integrated circuit arrangement as claimed in claim 1 in which the internal conductors carry reset signals to adjacent flip-flop circuits in a row.

3. An integrated circuit arrangement as claimed in claim 1 in which the internal conductors carry enable signals to adjacent flip-flop circuits in a row.

4. An integrated circuit arrangement as claimed in claim 3 in which the enable signals enable scan operations for device testing.

5. An integrated circuit arrangement as claimed in claim 3 in which the enable signals enable data operations.

6. An integrated circuit arrangement as claimed in claim 1 in which the internal conductors carry clock signals to adjacent flip-flop circuits in a row.

7. An integrated circuit, comprising:

one or more rows of combinatorial circuits;

one or more rows of flip-flop circuits, arranged in separate rows from combinatorial circuits, each of said flip-flop circuits having input and output terminals connected by internal conductors, with the flip-flop circuits within each respective row having uniformly arranged input and output terminals connected by internal conductors, with the input and output terminals arranged to mate with the input and output terminals of adjacent flip-flops within said respective row; and at least one buffer connected to ends of each of said rows of flip-flop circuits, said buffer providing global signals to said flip-flop circuits through said input terminals of a first flip-flop adjacent to said buffer, said global signal being conducted along said internal conductors through all flip-flop circuits in said row.

8. The integrated circuit of claim 7, wherein:

said flip-flop circuits are of first and second types, said first and second types of flip-flop circuits being controlled by first and second global signals, respectively, with flip-flop circuits of both types having first input and output terminals connected by first internal conductors positioned at first locations within said flip-flop circuits and second input and output terminals connected by second internal conductors positioned at second locations within said flip-flop circuits, with the flip-flop circuits arranged with the first input and output terminals mating with the first input and output terminals of adjacent flip-flop circuits and with second input and output terminals mating with the second input and output terminals of adjacent flip-flop circuits; and wherein at least two buffers are connected to ends of each row of flip-flop circuits, including a first buffer providing a first global signal controlling flip-flop circuits of said first type, with said first global signal transmitted through said first input and output terminals and along said first internal conductors of all flip-flop circuits in a row, and a second buffer providing a second global signal controlling said flip-flop circuits of said second type with said second global signal transmitted through said second input and output terminals and along said second internal conductors of all flip-flop circuits of said row.

9. An integrated circuit, comprising:

a row of flip-flop circuits, said flip-flop circuits being of first and second types, said first and second types of flip-flop circuits being controlled by first and second global signals, respectively, flip-flop circuits of both types having first input and output terminals connected by first internal conductors positioned at first locations within said flip-flop circuits and second input and output terminals connected by second internal conductors positioned at second locations within said flip-flop circuits, with the flip-flop circuits arranged with the first input and output terminals matching the first input and output terminals of adjacent flip-flops and with second input and output terminals matching the second input and output terminals of adjacent flip-flops; and at least two buffers connected to ends of each row of flip-flop circuits, including a first buffer providing a first global signal controlling flip-flop circuits of said first type, with said first global signal transmitted through said first input and output terminals and along said first internal conductors of all flip-flop circuits in a row, and a second buffer providing a second global signal controlling said flip-flop circuits of said second type, with said second global signal transmitted through said second input and output terminals and along said second internal conductors of all flip-flop circuits in said row.

* * * * *